United States Patent
Kostadinova et al.

(10) Patent No.: US 12,007,415 B2
(45) Date of Patent: Jun. 11, 2024

(54) ROGOWSKI CURRENT TRANSDUCER

(71) Applicant: LEM INTERNATIONAL SA, Meyrin (CH)

(72) Inventors: Aneliya Ninova Kostadinova, Sofia (BG); Pavel Olegov Ivanov, Sofia (BG)

(73) Assignee: LEM INTERNATIONAL SA, Plan-les-Ouates (CH)

( * ) Notice: Subject to any disclaimer, the term of this patent is extended or adjusted under 35 U.S.C. 154(b) by 235 days.

(21) Appl. No.: 17/635,870

(22) PCT Filed: Aug. 17, 2020

(86) PCT No.: PCT/EP2020/072960
§ 371 (c)(1),
(2) Date: Feb. 16, 2022

(87) PCT Pub. No.: WO2021/032661
PCT Pub. Date: Feb. 25, 2021

(65) Prior Publication Data
US 2022/0291258 A1    Sep. 15, 2022

(30) Foreign Application Priority Data

Aug. 20, 2019   (EP) ..................................... 19192727

(51) Int. Cl.
*G01R 15/18* (2006.01)
*G01R 19/00* (2006.01)
(52) U.S. Cl.
CPC ....... *G01R 15/181* (2013.01); *G01R 19/0092* (2013.01)
(58) Field of Classification Search
CPC .. G01R 15/181; G01R 19/0092; H01B 9/028; H01F 27/2823; H01F 27/288
(Continued)

(56) References Cited

U.S. PATENT DOCUMENTS 4,831,327 A * 5/1989 Chenier ............... G01R 15/181
324/96
2006/0232265 A1   10/2006 Fritsch
(Continued)

FOREIGN PATENT DOCUMENTS

| CN | 1120233 | 4/1996 |
| CN | 102033165 | 4/2011 |

(Continued)

OTHER PUBLICATIONS

International Search Report and Written Opinion issued by the European Patent Office, dated Oct. 27, 2020, for International Patent Application No. PCT/EP2020/072960; 18 pages.

(Continued)

*Primary Examiner* — Tung X Nguyen
*Assistant Examiner* — Robert P Alejnikov, Jr.
(74) *Attorney, Agent, or Firm* — Faegre Drinker Biddle & Reath LLP

(57) ABSTRACT

A current transducer including a Rogowski cable extending between a free end and a signal output connection end, a signal output cable connected to the signal output connection end of the Rogowski cable, and a connector comprising an electrically conductive magnetic core having a first cable end lodging cavity receiving the signal output connection end of the Rogowski cable therein, and a second cable end lodging cavity receiving the free end of the Rogowski cable therein, the Rogowski cable comprising an outer shielding layer connected to a conductor of the signal output cable configured for a ground connection. The current transducer further comprises a conductive grounding connection establishing an electrical contact between the magnetic core and the shielding conductor of the Rogowski cable.

14 Claims, 4 Drawing Sheets

(58) Field of Classification Search
USPC .......................................................... 324/126
See application file for complete search history.

(56) References Cited

U.S. PATENT DOCUMENTS

| | | |
|---|---|---|
| 2008/0211484 A1 | 9/2008 | Howell |
| 2011/0043190 A1 | 2/2011 | Farr |
| 2011/0148561 A1 | 6/2011 | Lint |
| 2012/0126789 A1* | 5/2012 | Turpin ................. G01R 15/181 |
| | | 324/117 R |
| 2016/0077133 A1 | 3/2016 | Lee |
| 2016/0327592 A1 | 11/2016 | Hewson |

FOREIGN PATENT DOCUMENTS

| | | | |
|---|---|---|---|
| CN | 106062570 | 10/2016 | |
| CN | 207743438 | 8/2018 | |
| EP | 0652441 | 5/1995 | |
| EP | 0851442 | 7/1998 | |
| EP | 1302773 | 4/2003 | |
| EP | 2009453 | 12/2008 | |
| EP | 3276363 | 1/2018 | |
| FR | 2803914 | 7/2001 | |
| JP | 4972098 B2 * | 7/2012 | ........... G01R 15/181 |
| WO | 2017/220827 | 12/2017 | |
| WO | 2018/108828 | 6/2018 | |

OTHER PUBLICATIONS

"Rogowski Coils Suit Relay Protection and Measurement", IEEE Computer Applications in Power, IEEE Inc., New York US, vol. 10, No. 3, Jul. 1, 1997; 6 pages.

* cited by examiner

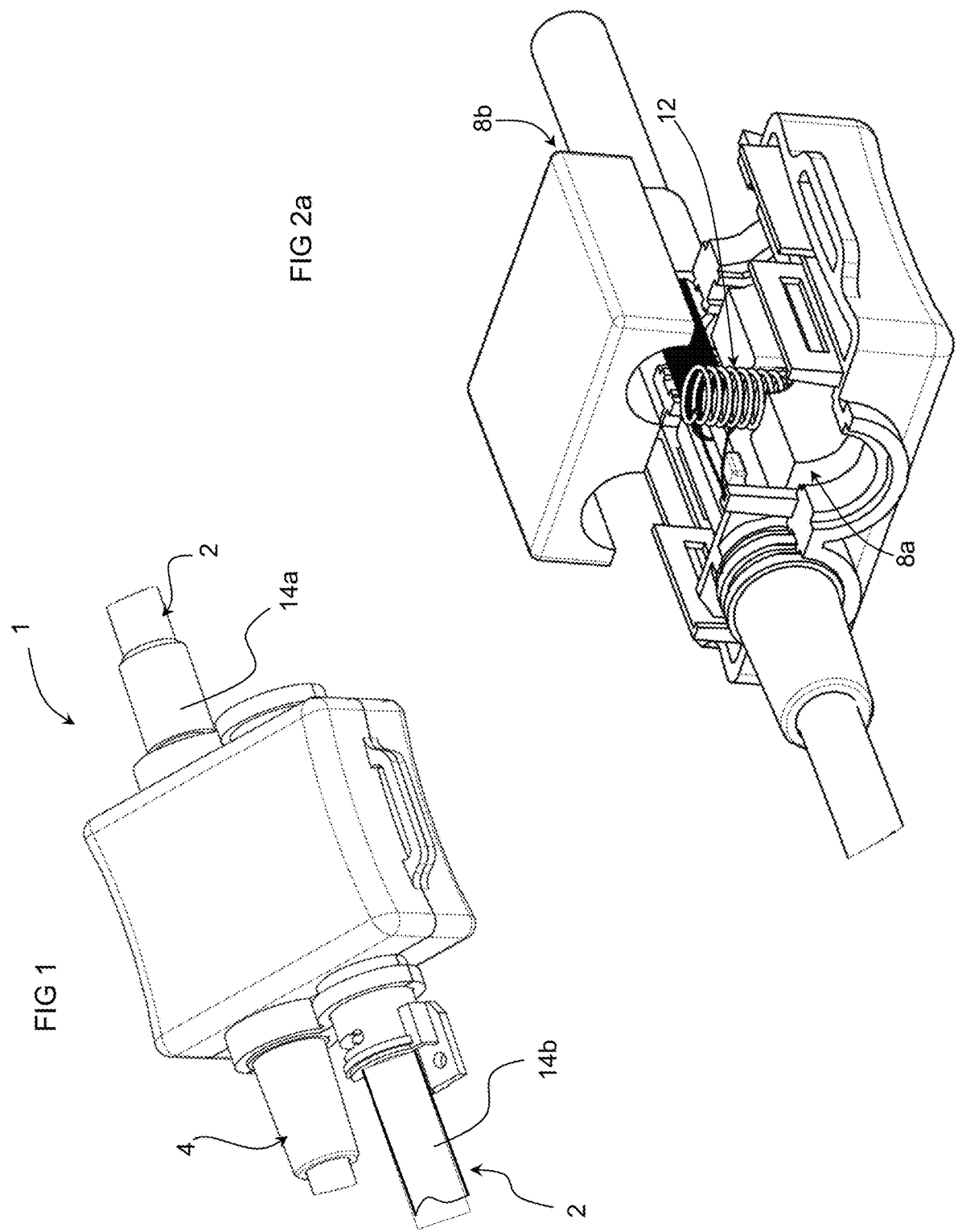

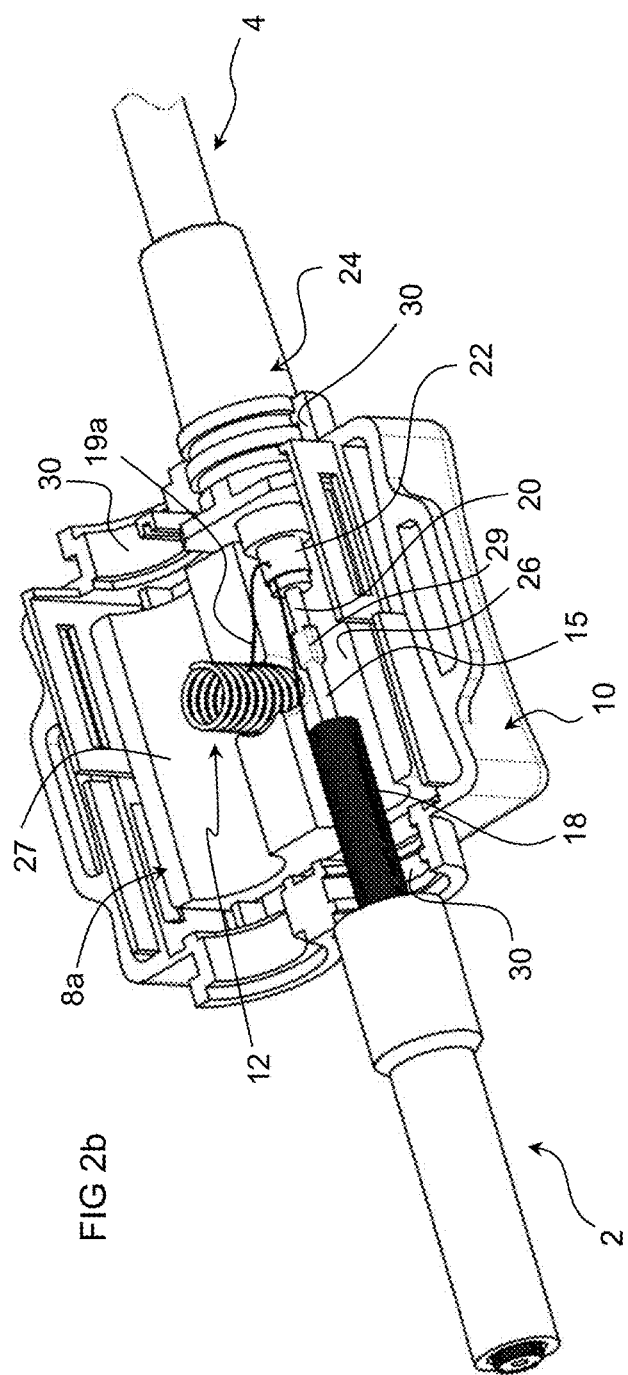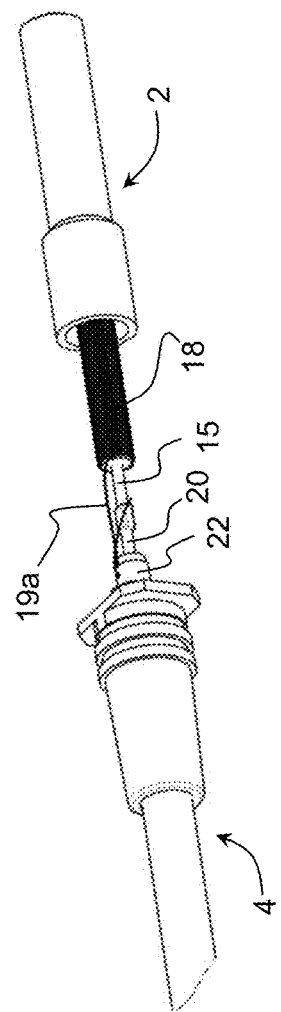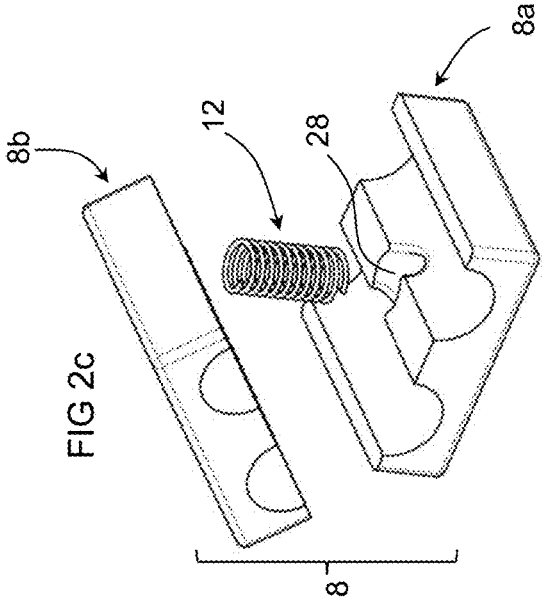

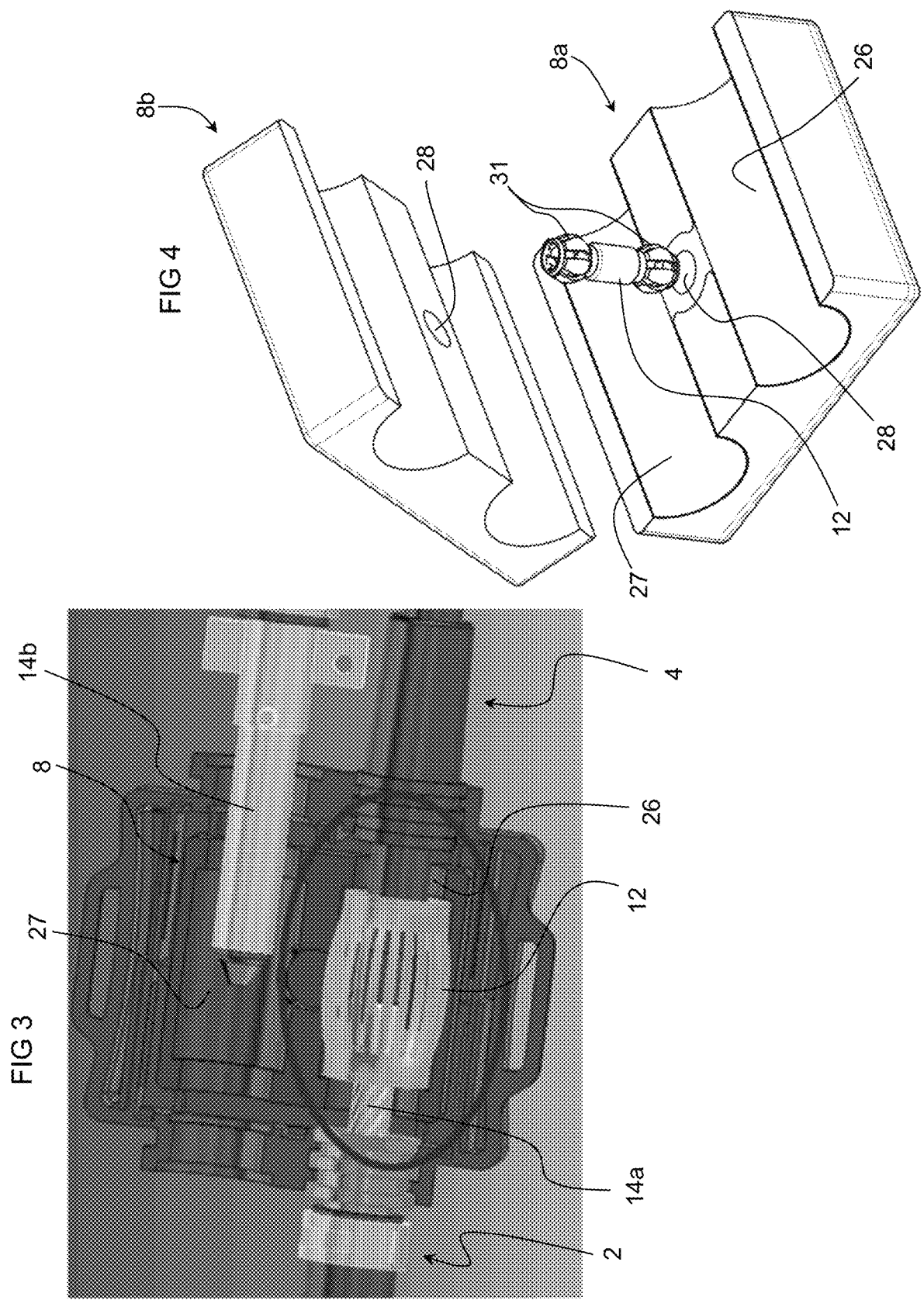

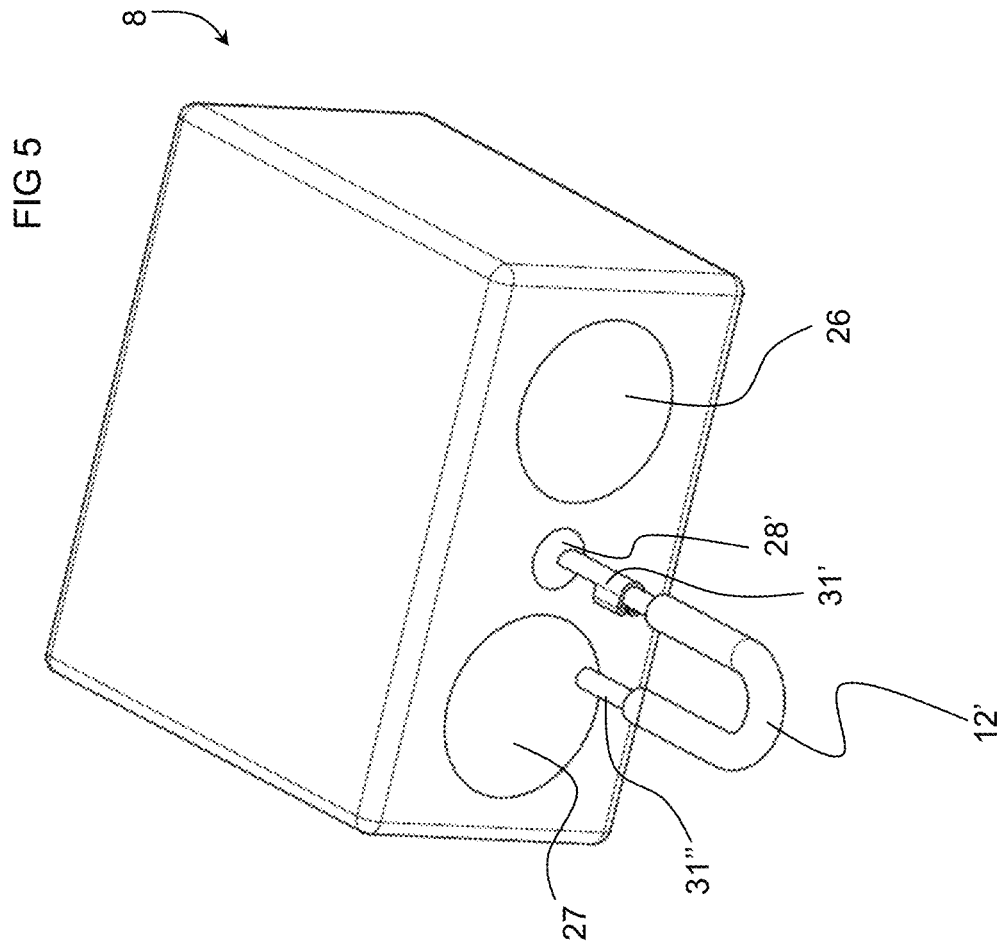

ROGOWSKI CURRENT TRANSDUCER

CROSS-REFERENCE TO RELATED APPLICATIONS

The present application is a national stage entry of International (PCT) Patent Application Number PCT/EP2020/072960, filed Aug. 17, 2020, which claims priority to European Patent Application Number 19192727.6, filed Aug. 20, 2019, the complete disclosures of which are expressly incorporated herein by reference.

The present invention relates to a Rogowski current transducer, in particular that is in the form of a cable that may be positioned around one or more primary conductors carrying a current to be measured.

A Rogowski current transducer in the form of a cable which can be positioned around a primary conductor is disclosed in EP2009453B1. The accuracy of Rogowski current transducers is affected by irregularities in the distribution of the Rogowski coil, whereby in the aforementioned document the cable ends are inserted into a connector comprising a core of a soft magnetic material in order to reduce the effect of the irregularities formed by the interconnection of the ends of the Rogowski coil. The magnetic core acts like a short circuit for the magnetic field thus reducing the interference of the ends of the cable on the measurement signal generated by the Rogowski coil. A signal output cable is connected at an end of the Rogowski cable positioned within the connector comprising the magnetic core.

One of the drawbacks of the known Rogowski type of current transducer however is that the ends of the Rogowski cable are sensitive to external electrical fields that can create disturbances on the signal measurement.

In view of the foregoing, it is an object of the invention to provide a Rogowski current transducer for mounting around one or more primary conductors, that can be easily installed yet is reliable, accurate and protected against external electrical disturbances.

It is advantageous to provide a Rogowski current transducer that is easy to implement and that is cost effective and compact.

Objects of the invention have been achieved by providing a Rogowski current transducer according to claim 1.

Disclosed herein is a current transducer including a Rogowski cable extending between a free end and a signal output connection end, a signal output cable connected to the signal output connection end of the Rogowski cable, and a connector comprising an electrically conductive magnetic core having a first cable end lodging cavity receiving the signal output connection end of the Rogowski cable therein, and a second cable end lodging cavity receiving the free end of the Rogowski cable therein, the Rogowski cable comprising an outer shielding layer connected to a conductor of the signal output cable configured for a ground connection. The current transducer further comprises a conductive grounding connection establishing an electrical contact between the magnetic core and the shielding conductor of the Rogowski cable.

In an advantageous embodiment, the magnetic core is made of a conductive ferrite material.

In an advantageous embodiment, the Rogowski cable comprises an inner conductor surrounded by an outer conductor wound around a dielectric layer to form a Rogowski coil, the Rogowski coil further comprising said outer shielding layer wound around the Rogowski coil.

In an advantageous embodiment, the signal output cable is in the form of a coaxial cable comprising an inner conductor and an outer conductor separated by a dielectric layer, the inner conductor of the signal output cable being connected to the inner conductor of the Rogowski cable, and the outer conductor of the signal output cable being connected to both the Rogowski coil and the outer shielding layer of the Rogowski cable.

In an advantageous embodiment, the outer shielding layer of the Rogowski cable is formed by a wire wound around the Rogowski coil.

In an advantageous embodiment, the second cable end lodging cavity is configured to slidably and removably receive the free end of the Rogowski cable therein.

In an advantageous embodiment, the magnetic core is formed of at least two parts assembled together, the conductive grounding connection being assembled between the two parts of the magnetic core and further establishing an electrical contact between said two parts.

In an embodiment, the grounding connection extends between a first end and a second end, the connection end of the outer shielding coil being connected at a substantially mid-point between said first and second ends of the grounding connection.

In an embodiment, the grounding connection may be in the form of a coil spring received in grounding connection receiving cavity cavities of the two magnetic core parts.

In an embodiment, the grounding connection may be in the form of an insert with spring contact end portions received in an elastically compressed state in grounding connection receiving cavity cavities of the two magnetic core parts.

In an embodiment, the grounding connection may be in the form of a multi-leaf spring coaxially mounted around the signal output connection end of the Rogowski cable.

In an embodiment, the grounding connection is in the form of a wire connection comprising a spring contact portion at one end that elastically inserts into a grounding connection cavity in the magnetic core, the other end of the wire connection electrically connected to the outer conductor of the signal output cable to establish the ground connection.

In an embodiment, the connector comprises an insulating housing within which the magnetic core is received, the housing comprising cable end entry portions configured to lockingly engage cable anchors of the signal output cable and signal output connection end of the Rogowski cable for securing the cables to the housing.

In an embodiment, the outer shielding coil formed of a wire conductor comprises a connection end connected to an outer conductor of the signal output cable.

Further objects and advantageous features of the invention will be apparent from the claims, from the detailed description, and annexed drawings, in which:

FIG. 1 is a perspective view of a Rogowski current transducer according to an embodiment of the invention with cable portions removed;

FIG. 2*a* is a perspective view of the current transducer of FIG. 1 with cable portions removed in a partially exploded view with a top housing part removed;

FIG. 2*b* is a view of the assembly of FIG. 2*a* with a top portion of a magnetic core part removed;

FIG. 2*c* is a perspective exploded view of a magnetic core and a conductive spring of the embodiment of FIGS. 1 and 2*a*;

FIG. 2d is a perspective view of a connection end of a Rogowski cable connected to a signal output cable of a current transducer according an embodiment of the invention;

FIG. 3 is a view similar to FIG. 2b showing some parts of another embodiment of the current transducer with a different variant of a grounding connection according to the invention;

FIG. 4 is a view similar to FIG. 2c showing another embodiment of the current transducer with yet another variant of a grounding connection according to the invention;

FIG. 5 is a perspective view of a magnetic core and grounding connection of a Rogowski current transducer according to another embodiment of the invention;

Referring to the figures, a current transducer 1 according to the embodiments of the invention comprises a Rogowski cable 2 extending between a free end 14b and a signal output connection end 14a, a signal output cable 4 connected to the signal output connection end of the Rogowski cable 2, and a connector for receiving the free end 14b and signal output connection end 14a of the Rogowski cable therein.

The Rogowski cable 2 comprises an inner conductor 15 surrounded by a dielectric layer in a coaxial arrangement and a Rogowski coil wound around the dielectric layer, the Rogowski coil also being coaxially arranged with respect to the inner conductor. The inner conductor and Rogowski coil may be formed from a single continuous conducting wire, or may be formed from two or more sections of a conductor that are interconnected together in series.

An outer shielding layer 18 is further wound around the Rogowski coil, whereby the shielding layer may be formed by an insulated wire that is wound as a coil around the Rogowski coil. The shielding layer may also be in the form of an insulated metallic tape that is wound around the Rogowski coil. The wire forming the Rogowski coil and/or the wire forming the shielding may be insulated, and optionally an insulating layer may be positioned around the Rogowski coil and between the Rogowski coil and the shielding layer. The insulating layer may be coaxially arranged around the Rogowski coil and may also be provided in the form of a tape of insulating material wound around the Rogowski coil or may be an extruded or molded insulating layer forming a sheath around the Rogowski coil. An insulating layer may further be provided around the shielding layer in order to protect the Rogowski cable.

The signal output cable is preferably in the form of a coaxial cable comprising an inner conductor 20 and an outer conductor 22 arranged coaxially therearound and separated from the inner conductor by a dielectric layer. Further, a protective insulation layer is positioned around the outer conductor 22. An end of the signal output cable comprises an anchor 24 for fixing to a housing 10 of the connector.

The connector comprises a magnetic core 8, preferably a ferrite core that is electrically conductive, mounted in a housing 10 that may be made of an insulating material such as a molded polymer.

In an advantageous embodiment, the magnetic core 8 is formed of at least two parts 8a, 8b including a base part 8a and a cover part 8b that are assembled together.

The magnetic core 8 comprises first and second cable end lodging cavities 26, 27. The magnetic core may further comprise a grounding connection receiving cavity 28 receiving a grounding connection 12, 12' therein.

The grounding connection 12, 12' consists of or comprises a conductive material, for instance of a metal alloy.

In advantageous embodiments., for instance as illustrated in FIGS. 2a-2c and 3, the grounding connection comprises a spring contact 12 configured to be in an elastically compressed position when the base and cover parts 8a, 8b of the magnetic core are closed together so as to elastically bias against the magnetic core and ensure conductive electrical contact between the grounding connection 12 and the magnetic core 8.

In a variant as illustrated in FIG. 4, the spring contact 12 comprises spring contact end portions 31 that are inserted into the grounding connection cavity 28 in an elastically compressed state to ensure conductive electrical contact between the grounding connection 12 and the magnetic core 8.

In the illustrated embodiment of FIGS. 2a-2c the grounding connection 12 is in the form of a coil spring, however other spring shapes such as a leaf spring may be provided within the scope of this invention. Various compressible spring configurations that are per se known may be inserted between the magnetic core parts 8a, 8b to press against the core parts and create an electrical contact therebetween. In the example of FIG. 3, the grounding connection comprises a multi-leaf spring coaxially mounted around the signal output connection end 14a of the Rogowski cable 2 and elastically compressed in the receiving cavity 26 of the magnetic core 8.

In the embodiment illustrated in FIG. 5, the grounding connection 12' is in the form of a wire connection 12' comprising a spring contact portion 31' at one end that elastically inserts into a grounding connection cavity 28' in the magnetic core 8. The other end 31" of the wire connection may be soldered, welded, clamped, or crimped to the outer shielding layer 18 and/or to the outer conductor 22 of the signal output cable to establish the ground connection.

The magnetic core may also in an embodiment be formed of a single part, in particular a single part conductive ferrite core, as illustrated in the embodiment of FIG. 5.

The Rogowski cable 2 extends from a free end 14a to a signal output connection end 14a connected to the connection end of the signal output cable 4.

The magnetic core comprises a first cable end lodging cavity 26 for receiving the signal output connection end 14a of the Rogowski coil and the connection end of the signal output cable 4, and a second cable end lodging cavity 27 allowing insertion of the free end 14b of the Rogowski cable therein when closing the current transducer around a primary conductor. Once the housing 10 and the magnetic core 8 are assembled around the signal output connection end 14a of the Rogowski cable and connection end of the signal output cable 4, the assembled parts of the housing 10 may be permanently locked together. The second cable end lodging cavity 27 allows slidable insertion and removal of the Rogowski cable free end 14b therein. The Rogowski cable free end may be held in the inserted position either by spring elements protruding into the cavity 27 (not shown) and engaging in an annular groove of the free end. In a variant, the Rogowski cable free end may be held in the inserted position by a bayonet connection or by other clamping couplings allowing removable insertion of the free end into the cavity 27 and locking.

As best seen FIGS. 2b and 2d, the inner conductor 15 of the Rogowski cable 2 may be interconnected to the inner conductor 20 of the coaxial signal output cable 4 by welding, soldering, crimping or by other per se known interconnection means. The outer end of the conductor forming the Rogowski coil may be connected to the outer conductor 22 of the signal output cable by welding, soldering or by crimping a connection ring therearound.

The connection end 19a of the wire conductor forming the outer shielding coil 18 may also be connected to the outer conductor 22 of the signal output cable by soldering, welding or a crimping ring. This configuration allows the outer shielding element to be connected to the outer conductor of the coaxial cable that may be connected to the ground, and to further connect the grounding connection to ground such that the conductive magnetic core is also connected to the ground. The magnetic core may thus act as both a magnetic shield and an electrical shield for the ends 14a, 14b of the Rogowski cable 2.

In an embodiment, the connection end 19a of the wire forming the outer shielding layer 18 may further extend to the grounding connection 12 and may be connected thereto by welding, soldering, or by a crimping element. In a variant, a separate conductor may be provided to interconnect the ground conductor of the signal output cable to the grounding connection 12. In the case of a coil spring (FIGS. 2b, 2c) or insert (FIG. 4) forming the conductive grounding connection 12, the conductor end 19a may advantageously be connected at a mid-point of the coil spring or insert.

In the embodiment of FIG. 3 with a coaxially arranged multi-leaf spring, a ring portion end of the leaf spring may be soldered or crimped to the outer layer 22 of the signal output cable 4 and/or to the outer shielding layer 18 of the Rogowski cable 2.

LIST OF REFERENCES USED

Current transducer 1
Rogowski cable 2
Signal output connection end 14a
Free end 14b
Inner conductor 15
   Connection 29
Outer coil 18
   Wire conductor
      Connection end 19a
Signal output cable 4 (coaxial cable)
Inner conductor 20
Outer conductor 22
   Coaxial conducting sheath 23
Cable anchor 24
Connector
Magnetic core 8 (Ferrite core)
   Base and cover parts 8a, 8b
   Cable end lodging cavities 26, 27
   Grounding connection receiving cavity 28, 28'
Housing 10
   Cable entry portions 30
Grounding connection 12, 12'
   Spring contact 12
      Conductive coil spring
      Conductive leaf spring
      Conductive insert with spring beam end portions
         Spring beam end portions 31
   Wire contact 12'
      End contact portions 31', 31"

The invention claimed is:

1. A current transducer including a Rogowski cable extending between a free end and a signal output connection end, a signal output cable connected to the signal output connection end of the Rogowski cable, and a connector comprising an electrically conductive magnetic core having a first cable end lodging cavity receiving the signal output connection end of the Rogowski cable therein, and a second cable end lodging cavity receiving the free end of the Rogowski cable therein, the Rogowski cable comprising an outer shielding layer connected to a conductor of the signal output cable configured for a ground connection, wherein the current transducer further comprises a conductive grounding connection establishing an electrical contact between the magnetic core and the shielding conductor of the Rogowski cable.

2. The current transducer according to claim 1, wherein the magnetic core is made of a ferrite material.

3. The current transducer according to claim 1, wherein the Rogowski cable comprises an inner conductor surrounded by an outer conductor wound around a dielectric layer to form a Rogowski coil, the Rogowski coil further comprising said outer shielding layer wound around the Rogowski coil.

4. The current transducer according to claim 3, wherein the signal output cable is in the form of a coaxial cable comprising an inner conductor and an outer conductor separated by a dielectric layer, the inner conductor of the signal output cable being connected to the inner conductor of the Rogowski cable, and the outer conductor of the signal output cable being connected to both the Rogowski coil and the outer shielding layer of the Rogowski cable.

5. The current transducer according to claim 4, wherein the outer shielding coil formed of a wire conductor comprises a connection end connected to the outer conductor of the signal output cable.

6. The current transducer according to claim 1, wherein the outer shielding layer of the Rogowski cable is formed by a wire wound around the Rogowski coil.

7. The current transducer according to claim 1, wherein the second cable end lodging cavity is configured to slidably and removably receive the free end of the Rogowski cable therein.

8. The current transducer according to claim 7, wherein the magnetic core is formed of at least two parts assembled together, the conductive grounding connection being assembled between the two parts of the magnetic core and further establishing an electrical contact between said two parts.

9. The current transducer according to claim 8, wherein the grounding connection extends between a first end and a second end, the connection end of the outer shielding coil being connected at a substantially mid-point between said first and second ends of the grounding connection.

10. The current transducer according to claim 8, wherein the grounding connection is in the form of a coil spring received in grounding connection receiving cavity cavities of the magnetic core parts.

11. The current transducer according to claim 8, wherein the grounding connection is in the form of an insert with spring contact end portions received in an elastically compressed state in grounding connection receiving cavity cavities of the magnetic core parts.

12. The current transducer according to claim 1, wherein the grounding connection is in the form of a multi-leaf spring coaxially mounted around the signal output connection end of the Rogowski cable.

13. The current transducer according to claim 1, wherein the grounding connection is in the form of a wire connection comprising a spring contact portion at one end that elastically inserts into a grounding connection cavity in the magnetic core, the other end of the wire connection electrically connected to the outer conductor of the signal output cable to establish the ground connection.

14. The current transducer according to claim 1, wherein the connector comprises an insulating housing within which the magnetic core is received, the housing comprising cable end entry portions configured to lockingly engage cable anchors of the signal output cable and signal output connection end of the Rogowski cable for securing the cables to the housing.

\* \* \* \* \*